United States Patent

Yoshikawa et al.

[11] Patent Number: 5,529,631
[45] Date of Patent: Jun. 25, 1996

[54] APPARATUS FOR THE CONTINUOUS SURFACE TREATMENT OF SHEET MATERIAL

[75] Inventors: Masato Yoshikawa, Kodaira; Yukihiro Kusano, Tokorozawa; Hideyuki Niwa; Yukio Fukuura, both of Sayama; Kazuo Naito, Kawasaki; Satiko Okazaki, No. 20-11, Takaidohigashi 2-chome, Suginami-ku, Tokyo; Masuhiro Kogoma, No. 843-15, Shimoniikura, Wakou-shi, Saitama-ken, all of Japan

[73] Assignees: Bridgestone Corporation; Satiko Okazaki, both of Tokyo; Masuhiro Kogoma, Wakou, all of Japan

[21] Appl. No.: 513,007

[22] Filed: Aug. 9, 1995

Related U.S. Application Data

[62] Division of Ser. No. 210,746, Mar. 21, 1994, abandoned, which is a continuation of Ser. No. 945,588, Sep. 16, 1992, abandoned, which is a continuation of Ser. No. 604,244, Oct. 29, 1990, abandoned.

[30] Foreign Application Priority Data

Oct. 30, 1989 [JP] Japan ..................... 1-282753

[51] Int. Cl.⁶ .................................. C23C 16/00
[52] U.S. Cl. .................. 118/718; 118/50.1; 118/720; 118/723 R; 118/729
[58] Field of Search .................... 118/718, 720, 118/723 R, 729, 50.1

[56] References Cited

U.S. PATENT DOCUMENTS

| | | | |
|---|---|---|---|
| 5,041,304 | 8/1991 | Kusano et al. | 427/41 |
| 5,225,659 | 7/1993 | Kusano et al. | 249/121.59 |
| 5,286,532 | 2/1994 | Yoshikawa et al. | 427/536 |

*Primary Examiner*—Bernard Pianalto
*Attorney, Agent, or Firm*—Oblon, Spivak, McClelland, Maier & Neustadt

[57] ABSTRACT

A length of sheet material is continuously surface treated, typically modified or coated, by continuously feeding helium gas or a helium gas mixture into a treating chamber while a plasma region is created in the gas under atmospheric pressure, continuously moving a length of sheet material into and out of the chamber through entrance and exit ports to pass through the plasma region, thereby continuously subjecting the sheet at either surface to plasma discharge treatment. The entrance and exit ports are sealed in a less gas tight manner to allow leakage of the helium gas or gas mixture.

7 Claims, 3 Drawing Sheets

APPARATUS FOR THE CONTINUOUS SURFACE TREATMENT OF SHEET MATERIAL

This is a division, of application Ser. No. 08/210,746, filed on Mar. 21, 1994, now abandoned, which is a continuation of application Ser. No. 07/945,588, filed on Sep. 16, 1992, now abandoned, which is a continuation of application Ser. No. 07/604,244, filed on Oct. 29, 1990, now abandoned.

This invention relates to a method and apparatus for the continuous surface treatment of a length of sheet material under atmospheric pressure for surface modification and coating purposes.

BACKGROUND OF THE INVENTION

Several methods for modifying or coating the surface of sheet material were known in the art, for example, plasma treatment by glow discharge in vacuum, plasma polymerization, and plasma chemical vapor deposition. Typical of such known methods for the continuous surface treatment of sheet material are a batch system in which a length of sheet material is continuously unraveled from its roll in a vacuum chamber where the sheet surface is continuously treated, and a differential evacuation system in which the chamber is gradually evacuated from atmospheric pressure to a vacuum as disclosed in Japanese Patent Publication No. 65093/1988. These methods, either batchwise or continuous, use a large size of equipment and require a pump of an increased capacity for evacuating the large chamber.

It is also known to apply electric discharge treatment to the surface of sheet material in a gas mixture under atmospheric pressure as disclosed in Japanese Patent Application Kokai No. 235339/1987, and Japanese Patent Application Nos. 138630/1988, 166599/1988, and 202977/1988. All these methods are batchwise. Although treatment under atmospheric pressure is advantageous, shielding from the ambient atmosphere by a chamber is necessary. For continuous treatment, a roll of sheet material should be placed in a chamber, for example, a large size closed tank where treatment is carried out. Therefore, the size and attachments required for the equipment are basically the same as in the aforementioned vacuum treatment.

There is a demand for method and apparatus capable of continuously modifying or coating the surface of a sheet material in a uniform fashion without a need for a large size closed tank or a pump of high capacity.

SUMMARY OF THE INVENTION

The inventors have found that by creating a plasma region in helium gas or a gas mixture composed predominantly of helium gas, a uniform stable plasma discharge is established even under atmospheric pressure, whereby a sheet material can be subjected to plasma discharge treatment in the region. In continuously moving a length of sheet material into and out of a chamber where the plasma region is created through entrance and exit ports whereby the sheet on the surface is continuously subjected to plasma discharge treatment, it is unnecessary to seal the entrance and exit ports in a full gas tight manner, and a less than gas tight seal allowing leakage of helium gas or gas mixture from within the chamber can maintain a sufficient purity of helium gas or gas mixture to ensure satisfactory plasma discharge treatment. Since this avoids the need to place a roll of sheet material in the chamber, the chamber may be of a size allowing continuous passage of a length of sheet material, achieving a substantial size reduction as compared with the prior art chambers. The vacuum pump may be of smaller size since it is used only when initially purging the air in the chamber with helium gas or a gas mixture and the chamber need not be maintained in vacuum at all times. As a result, the overall apparatus can be reduced in size.

According to the present invention, there is provided a method for the continuous surface treatment of a length of sheet material, comprising the steps of:

purging air in a treating chamber with helium gas or a gas mixture predominantly comprising helium gas, continuously feeding helium gas or a gas mixture predominantly comprising helium gas into the chamber, creating a plasma region in the helium gas or gas mixture under atmospheric pressure, continuously introducing a length of sheet material into the plasma region from without said chamber through an entrance port which is sealed in a less gas tight manner to allow leakage of the helium gas or gas mixture, thereby continuously subjecting the sheet at its surface to plasma discharge treatment, and continuously removing the portion of the sheet that has been treated from within said chamber through an exit port which is sealed in a less gas tight manner to allow leakage of the helium gas or gas mixture.

The surface treatment used herein encompasses surface modification and coating.

According to another aspect, the present invention provides an apparatus for the continuous surface treatment of a length of sheet material, comprising a treating chamber adapted to receive therein helium gas or a gas mixture predominantly comprising helium gas and including entrance and exit ports for passage of a length of sheet material therethrough, means in the chamber for creating a plasma region in the helium gas or gas mixture, vent means for evacuating air from within said chamber, feed means for feeding helium gas or a gas mixture predominantly comprising helium gas into said chamber, seal means for sealing the entrance and exit ports in a less gas tight manner to allow leakage of the helium gas or gas mixture, and means for continuously moving the length of sheet material into and out of said chamber through the entrance and exit ports, whereby the sheet is passed through the plasma region where the sheet on its surface is continuously subjected to plasma discharge treatment.

Typically, the plasma creating means includes a pair of spaced apart electrodes disposed in the chamber and a power supply disposed outside the chamber and electrically connected to the electrode.

Preferably, the gas mixture is a mixture of helium gas and 0 to 30% by volume of the helium gas of a member selected from the group consisting of $O_2$, $N_2$, $CF_4$, $C_2F_6$, $CH_4$, and $C_2H_4$. A plasma discharge is produced by applying a voltage of 0.5 to 10 kV at a frequency of at least 50 Hz.

BRIEF DESCRIPTION OF THE DRAWINGS

The above and other objects, features, and advantages of the present invention will be better understood from the following description taken in conjunction with the accompanying drawings, in which:

FIG. 6 is a cross sectional view, FIG. 7 being a cross sectional view taken along lines VII—VII in FIG. 6, FIG. 8 being a cross sectional view.

Like parts are designated by the same reference numerals throughout the figures.

DESCRIPTION OF THE PREFERRED EMBODIMENTS

Figure 1:
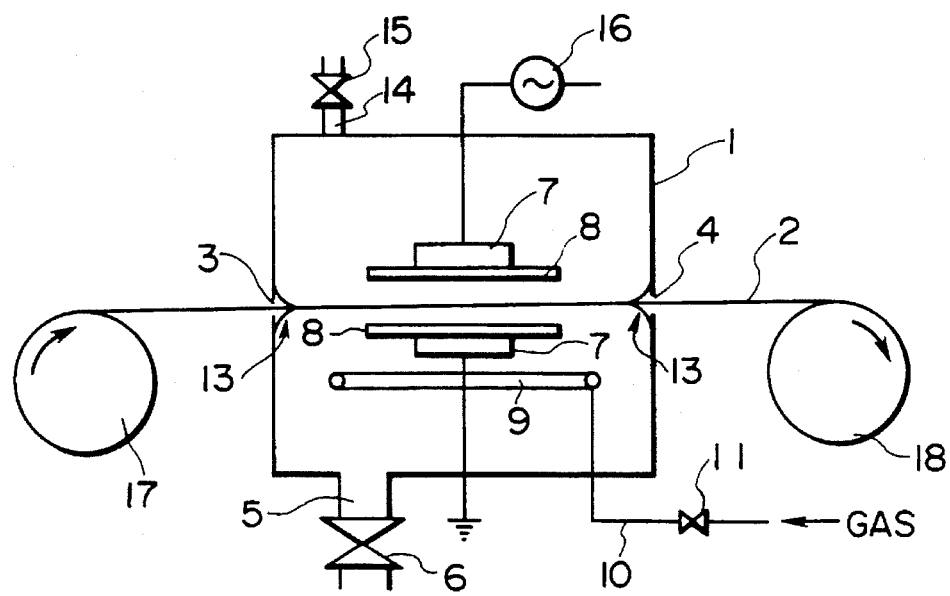
FIG. 1 schematically illustrates one embodiment of the surface treating apparatus of the present invention.

Referring to FIG. 1, there is illustrated an apparatus for continuously modifying or coating a length of sheet material on its surface according to one embodiment of the present invention. The apparatus includes a treating chamber 1 defined by two pairs of opposed side walls and a pair of opposed top and bottom walls. One pair of side walls are provided with an entrance port 3 for introducing a length of sheet material 2 and an exit port 4 through which the portion of the sheet which has been treated in the chamber 1 is moved out of the chamber. The bottom wall is provided with a vent port 5 for evacuating the air in the chamber. The vent port 5 is connected to a vacuum pump (not shown) through a valve 6 for normally closing the vent port. In the chamber 1 are disposed a pair of spaced apart parallel electrodes 7 and 7 of plate metal, with insulating thin film covers 8 and 8 attached to the opposed inner surfaces of the electrodes 7 and 7, respectively. The chamber 1 is provided with means for feeding helium gas or a gas mixture predominantly comprising helium gas into the chamber 1. The gas feed means includes a sparger tube 9, a conduit 10, a valve 11, a pump and a gas source connected in series gas flow (the last two not shown).

Figure 2:
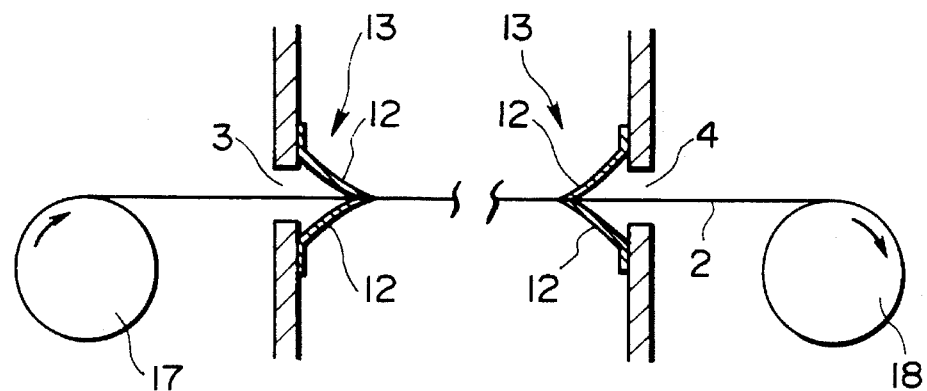
FIG. 2 is an enlarged cross sectional view of the entrance and exit ports of the apparatus.

The entrance and exit ports 3 and 4 are provided with seal means 13 and 13. As shown in FIG. 2, the seal means is a check valve means comprising a pair of flexible plastic skirts 12 and 12 with one end attached to the inside of the side wall above and below the port or opening 3 (or 4) so that the skirts extend obliquely and face each other. The skirts 12 and 12 mate with each other at their free end while the sheet 2 is interposed therebetween. The chamber 1 is further provided with a gas vent port 14 in the top wall having a valve 15. Outside the chamber 1, the apparatus further includes a stabilized power supply 16 for applying voltage across the electrodes 7 and 7, a feed roll 17 in the form of a roll of sheet material to be treated, and a take-up roll 18 for taking up the treated sheet. The feed and take-up rolls 17 and 18 are preferably located in register with the entrance and exit ports 3 and 4. With this arrangement, the sheet 2 is unraveled from the feed roll 17, introduced into the chamber 1 through the entrance port 3, passed between the electrodes 7 and 7, moved out of the chamber 1 through the exit port 4, and recovered on the take-up roll 18.

The insulating thin film covers 8 and 8 are not particularly limited in material and dimensions, although their thickness preferably ranges from 0.001 to 3 mm. Especially, one attached to the upper electrode connected to the power supply is preferably thinner than about 1 mm.

Figure 3:
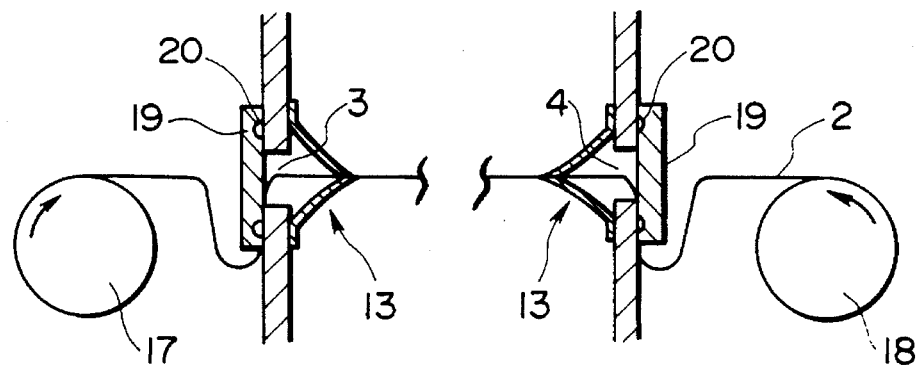
FIG. 3 is an enlarged cross sectional view of the same portion as FIG. 2 showing the ports closed with lids in a helium gas purging step.

The apparatus is operated to modify or coat the sheet material on the opposed major surfaces. First of all, the entrance and exit ports 3 and 4 in the chamber side walls are closed with lids 19 and 19 each in the form of a plate having an O-ring 20 embedded therein for sealing purpose as shown in FIG. 3. The valve 6 is opened and the vacuum pump is actuated to evacuate the air from the chamber 1 through the vent port 5. It will be noted that the valves 11 and 15 are closed at this point. Then the valve 11 is opened to introduce high purity helium gas into the chamber 1, thereby purging the air with helium gas in the chamber 1. With the valve 11 kept open, helium gas or a gas mixture predominantly comprising helium gas is continuously fed into the chamber 1 through the conduit 10 and sparger tube 9. The lids 19 and 19 are removed at this point. Voltage is applied across the electrodes 7 and 7 from the power supply 16 to create a plasma region in the helium gas or gas mixture between the electrodes. The sheet 2 is continuously fed from the feed roll 17, passed through the chamber 1, and wound on the take-up roll 18. The sheet 2 on its opposed major surfaces is continuously subject to plasma discharge treatment in the plasma region between the electrodes 7 and 7 during passage through the chamber 1 while the sheet as treated is continuously recovered on the take-up roll 18.

The gas mixture predominantly comprising helium gas used herein includes gas mixtures of helium with an additional gas such as $O_2$, $N_2$, $CF_4$, $C_2F_6$, $CH_4$, $C_2H_4$ or the like. The proportion of the additional gas is 0 to 30% by volume based on the volume of helium. The gas mixture is also referred to as reaction gas. The power applied across the electrodes 7 and 7 preferably has a frequency of at least 50 Hz, especially at least 500 Hz and a voltage of 0.5 to 10 kilovolts because a stable discharge is produced within this range. The treating rate is set to provide a treating time of 0.1 to 1,000 seconds, especially 0.5 to 300 seconds at a point on the sheet.

In the treating apparatus, the seal means 13 functions to seal the associated port in a less gas tight manner to allow leakage of the helium gas or helium gas mixture from the chamber 1, but does not provide a full gas tight seal to the associated port to completely shield the chamber from the exterior. The less gas tight seal to allow leakage of the helium gas or helium gas mixture, assisted by continuous supply of helium gas or helium gas mixture to the chamber, does not disturb the plasma region, but is effective to maintain the plasma region stable, ensuring satisfactory surface modification or coating.

The above-mentioned method allows the sheet material to be modified or coated on its surfaces in a continuous mode. The roll of sheet material is not placed within the chamber, but the sheet unwound from the roll is transferred through the plasma region in the chamber. The chamber can be of substantially small dimensions as compared with the conventional chambers. The method and apparatus of the invention can accommodate an increased length of sheet material without increasing the chamber dimensions. The throughput of sheet material which can be treated is drastically increased. Since a vacuum pump is used only for initially purging the chamber with helium gas and subsequent maintenance of the chamber in vacuum is unnecessary, the vacuum pump may be of a reduced capacity. Therefore, not only the chamber, but also the entire apparatus can be of reduced dimensions. Further the operating cost of the vacuum pump is markedly reduced. Since the sheet is continuously introduced into the chamber from the exterior, it is possible to feed the sheet directly from its preparation step to the treating chamber. This leads to an in-line manufacture system.

Figure 4:
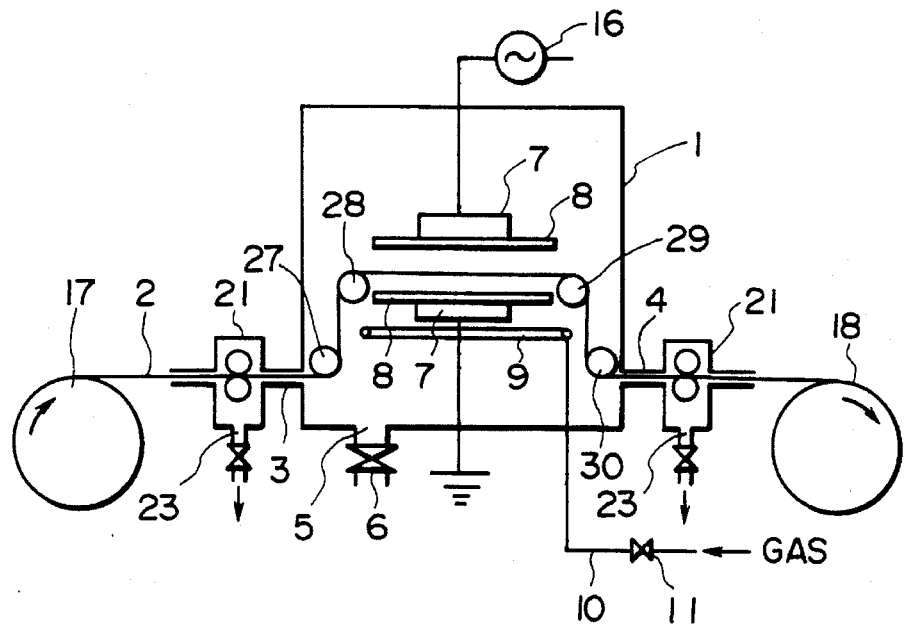
FIG. 4 schematically illustrates another embodiment of the surface treating apparatus of the present invention.
Figure 5:
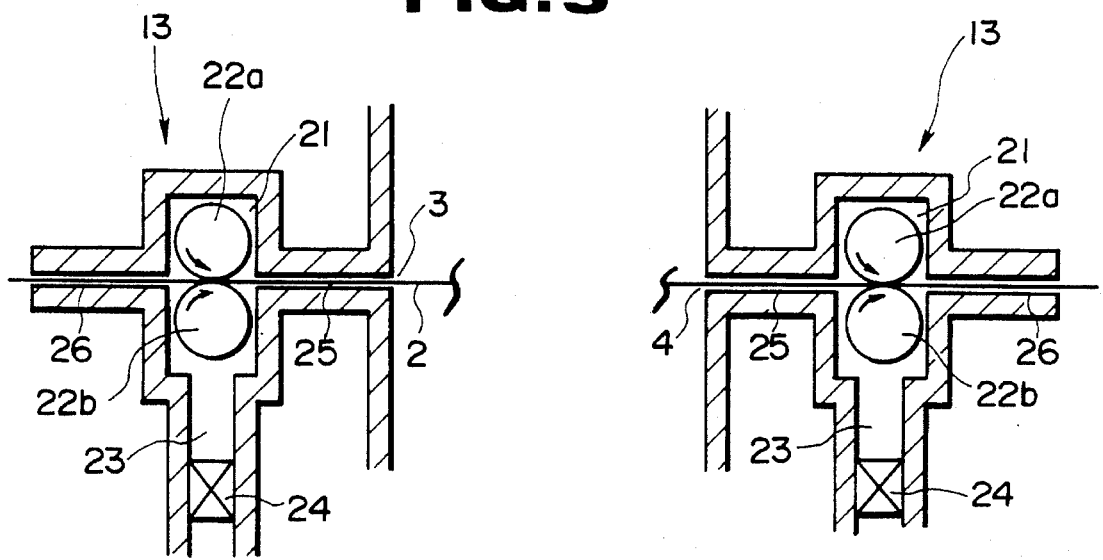
FIG. 5 is an enlarged cross sectional view of the entrance and exit ports of the apparatus of FIG. 4.

FIGS. 4 and 5 illustrate an apparatus for continuously modifying or coating a length of sheet material on its surface according to another embodiment of the present invention. The same components as in the apparatus of FIGS. 1 to 3 are designated by the same reference numerals and their description is omitted.

In the embodiment of FIG. 4, the entrance and exit ports 3 and 4 for sheet transfer are located at a lower portion of the opposed side walls of the chamber 1 below the electrodes 8 and 8. Guide rollers 27 to 30 are disposed in the chamber 1 to define a path along which the sheet travels. The sheet is introduced into the chamber 1 through the entrance port 3, turned up by first and second guide rollers 27 and 28 to a position in alignment with the electrodes 7 and 7, passed between the electrodes 7 and 7, turned down by third and fourth guide rollers 29 and 30 to a position in line with the exit port 4, and finally moved out of the chamber 1 through the exit port 4.

Seal means 13 associated with the entrance and exit ports 3 and 4 are disposed outside the chamber 1. More particularly, slit means 21 and 21 are attached to the chamber walls for defining slits opening at the entrance and exit ports 3 and 4, respectively. In each slit means 21, as shown in FIG. 5, a pair of upper and lower guide rollers 22a and 22b are disposed in tangential contact to move the sheet 2 into and out of the chamber 1 through frictional engagement therebetween. Each slit means 21 at the bottom is provided with an auxiliary air vent 23 which is controlledly opened or closed by a valve 24. The slit means 21 further include an inner slit 25 communicating with the chamber 1 and an outer slit 26 communicating with the exterior. Both the slits 25 and 26 are vertically as narrow as possible insofar as they does not interfere with passage of the sheet, preferably so narrow as to leave a gap of 0.01 to 0.5 mm between their wall and the passing sheet.

A length of sheet material is modified or coated on its major surfaces by means of the apparatus shown in FIGS. 4 and 5 by first evacuating air in the treating chamber 1 through the air vent 5 associated with the chamber 1 and the auxiliary vents 23 and 23 associated with the slit means 21 and 21. Then the valve 11 is opened to feed high purity helium gas into the chamber 1, purging the air in the chamber with helium gas. The subsequent steps are the same as previously described for the embodiment of FIG. 1. In this way, the sheet is subjected to surface modification or coating.

The seal means 13 shown in FIG. 5 provide a less gas tight seal like those of FIG. 2 and assist in establishing a stable plasma region between the electrodes 7 and 7. The surface modification or coating of a sheet material with the apparatus of FIG. 4 provides the same benefits and advantages as with the apparatus of FIG. 1. The location of the entrance and exit ports 3 and 4 near the bottom of the chamber 1 provides an additional advantage in that helium gas having a lower specific gravity is less likely to leak to the exterior through the entrance and exit ports 3 and 4, permitting effective treatment even with a smaller flow rate of reaction gas.

The method and apparatus for continuously treating a sheet material according to the present invention are not limited to the above-illustrated embodiments and changes and variations may be made without departing from the scope of the invention. For example, in the apparatus shown in FIGS. 1 and 4, the seal means associated with the entrance and exit ports 3 and 4 for the sheet shown in FIGS. 2 and 5 may be replaced by other seal means as shown in FIGS. 6 to 8.

Figure 6:
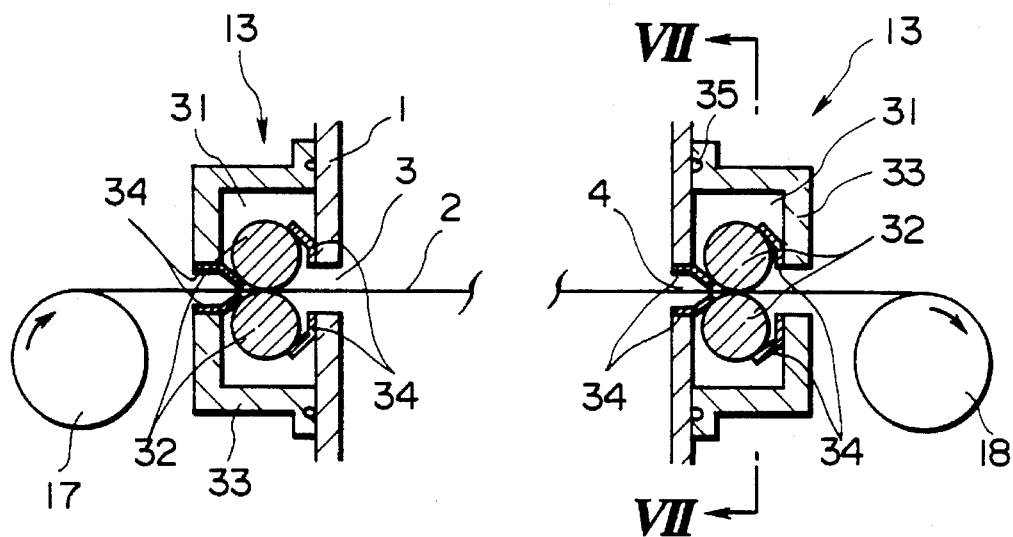
FIGS. 6 to 8 illustrate different examples of the sealing means.
Figure 7:
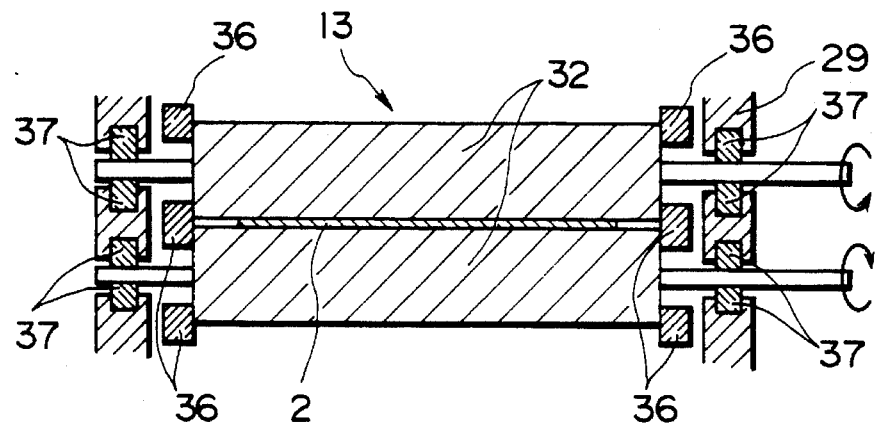

The seal means 13 shown in FIGS. 6 and 7 includes roller compartments 31 and 31 which enclose the entrance and exit ports 3 and 4 from the outside, respectively. In each roller compartment 31 are disposed a pair of upper and lower pressure rollers 32 and 32. Valve-forming pairs of flexible film skirts 34 are provided between the rollers 32 and the chamber 1 and between the rollers 32 and the compartment housing 33, respectively. The compartment housing 33 has embedded therein an O-ring 35 in abutment with the chamber wall as shown in FIG. 6. The rollers 32 are sealed with side shields 36 at opposed ends and shafts of the rollers 32 are pivotally mounted in the compartment housing 33 through seal bearings 37 as shown in FIG. 7.

Figure 8:
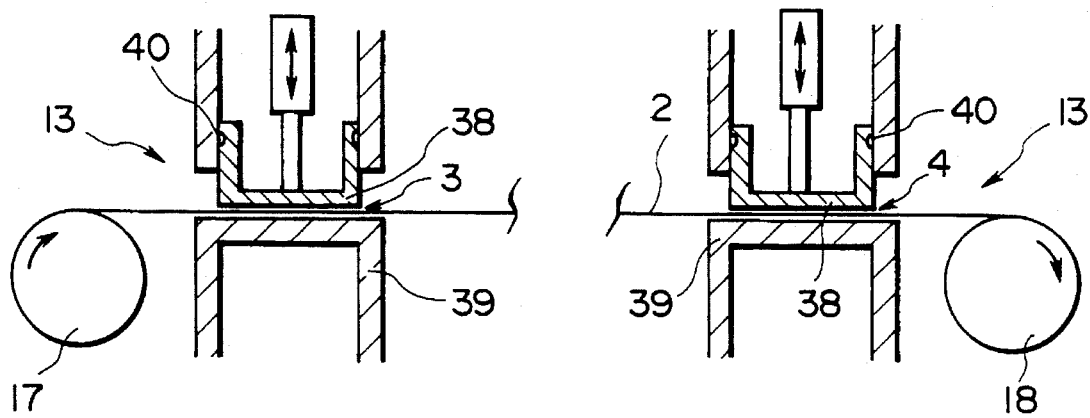

The seal means 13 shown in FIG. 8 include vertically movable pistons 38 and 38 and seats 39 and 39, the respective ones of the pistons and seats defining the entrance and exit ports 3 and 4. By moving the pistons 38, the entrance and exit ports 3 and 4 can be adjusted to a minimum gap for allowing the sheet to pass therethrough without contact, that is, leaving a narrow clearance on either side of the sheet. In FIG. 8, 40 is an O-ring. This seal means has another advantage that when the air in the chamber 1 is purged with helium gas, the pistons 38 is pressed against the seats 39 via the sheet 2 to completely block the entrance and exit ports 3 and 4.

As understood from the foregoing teachings, the method and apparatus for continuously treating a sheet material according to the present invention have many advantages and benefits. The treating chamber and the vacuum pump can be substantially reduced in size and capacity while a sheet material on either surface can be continuously subjected to uniform and effective modification or coating. An increased length of sheet material can be easily treated without enlarging the apparatus. A significantly increased throughput is thus expected. The treating apparatus may be operated in line with the sheet manufacturing apparatus.

Experiments are shown below.

EXPERIMENT 1

Using the apparatus of FIG. 1 with seal means of FIG. 2, the following procedure was carried out. A polyester sheet of 100 μm thick on either surface was subjected to hydrophilic treatment at varying treating rates. The treated polyester sheet on the surface was measured for contact angle with water.

Procedure

With the polyester sheet 2 extended, the entrance and exit ports 3 and 4 were blocked with the lids 19 and 19 through O-rings 20 and 20 as shown in FIG. 3. The vacuum pump was operated to evacuate air in the chamber 1 through the air vent 5 until a vacuum of $1 \times 10^{-2}$ Torr was reached. The valve 6 was closed and the valve 11 was opened to feed high purity helium gas into the chamber 1, purging the chamber 1 with helium gas. Then a gas mixture of helium gas and oxygen in a volume ratio $He/O_2$ of 99/1 was fed into the chamber at a predetermined flow rate through the valve 11, conduit 10 and sparger tube 9. After the lids were removed, the take-up roll 18 was rotated to continuously transfer the polyester sheet 2 from the entrance port 3 to the exit port 4, while a low frequency power at 8 kHz and 2 kV was applied across the electrodes 7 and 7 from the stabilized power supply 16 to develop a plasma region between the electrodes. The polyester sheet 2 on either surface was continuously exposed to a discharge plasma in the plasma region.

The results are shown in Table 1.

TABLE 1

| Sheet moving speed (m/min.) | Treating time* (sec.) | Contact angle** (deg.) |
| --- | --- | --- |
| 3 | 2 | 29.8 |
| 1 | 6 | 30.1 |
| 0.3 | 20 | 30.2 |
| 0.1 | 60 | 30.0 |
| Control | — | 75.2 |

*the retention time of a point on the sheet in the plasma region
**an average of 20 randomly selected measurements As evident from Table 1, the sheet samples treated at varying treating rates and times showed a markedly reduced contact angle as compared with Control (no treatment), indicating that the polyester sheet on either surface was continuously and uniformly rendered hydrophilic.

For comparison purposes, a similar procedure was repeated after the seal means 13 were removed from the entrance and exit ports 3 and 4. The ambient air flowed into the chamber through the entrance and exit ports 3 and 4. A discharge could not be started by applying voltage across the electrodes 7 and 7, failing to conduct treatment.

EXPERIMENT 2

The same apparatus as shown in FIG. 1 was used except that the seal means of FIG. 2 were replaced by the seal means of FIGS. 6 and 7. The reaction gas used was a gas mixture of helium gas and $CF_4$ in a volume ratio He/$CF_4$ of 99:1. Audio wave at 8 kHz and 3 kV was applied across the electrodes. A length of cotton fabric on either surface was subjected to water repellent treatment by the same procedure as in Experiment 1. Contact angle was measured. The results are shown in Table 2.

TABLE 2

| Sheet moving speed (m/min.) | Treating time* (sec.) | Contact angle** (deg.) |
| --- | --- | --- |
| 3 | 2 | 130.2 |
| 1 | 6 | 129.8 |
| 0.3 | 20 | 130.4 |
| 0.1 | 60 | 130.3 |
| Control | — | 0 (penetrate) |

*the retention time of a point on the sheet in the plasma region
**an average of 20 randomly selected measurements

EXPERIMENT 3

The same apparatus as shown in FIG. 1 was used except that the seal means of FIG. 2 were replaced by the seal means of FIG. 8. A rubber sheet obtained by shaping and vulcanizing the rubber composition shown in Table 3 was subjected on either surface to water repellent treatment by the following procedure. After the treatment, contact angle and average coefficient of friction on the rubber sheet surface were measured. The latter was measured using a friction tester manufactured by Karo Iron Works K.K.

The results are shown in Table 4.

Procedure

The rubber sheet 2 was extended in the treating apparatus. The pistons 38 and 38 were moved down to close the entrance and exit ports 3 and 4 while utilizing the rubber sheet 2 itself as a sealing member. The chamber 1 was evacuated to a vacuum and filled with helium gas as in Experiment 1. A reaction gas in the form of $CF_4$ gas diluted to a concentration of 1% by volume with helium gas was fed at a predetermined flow rate. The pistons 38 and 38 were moved up to form narrow gaps as the entrance and exit ports 3 and 4 for allowing the sheet to pass therethrough without contact. The sheet 2 was continuously moved forward through the chamber 1. Audio wave at 8 kHz and 3 kV was applied across the electrodes 7 and 7. The rubber sheet on either surface was fluorinated.

TABLE 3

| Ingredients | Parts by weight |
| --- | --- |
| Ethylene-propylene copolymer rubber (EPDM) | 100 |
| Carbon black | 30 |
| Stearic acid | 1 |
| Zinc oxide | 5 |
| Tetramethylthiurammonosulfide | 1 |
| Sulfur | 1.5 |

TABLE 4

| Sheet moving speed (m/min.) | Treating time* (sec.) | Contact time** (deg.) | Average coefficient friction |
| --- | --- | --- | --- |
| 3 | 2 | 150.2 | 1.2 |
| 1 | 6 | 151.0 | 1.1 |
| 0.3 | 20 | 150.6 | 1.2 |
| 0.1 | 60 | 150.0 | 1.0 |
| Control | — | 100 | 3.2 |

*the retention time of a point on the sheet in the plasma region
**an average of 20 randomly selected measurements As evident from Table 4, the sheet samples treated at varying treating rates and times showed a markedly increased contact angle as compared with Control (no treatment), indicating that the rubber sheet on the surface was uniformly rendered water repellent through the continuous treatment. The treated rubber sheet on the surface showed an average coefficient of friction which was reduced by ⅓ from that of Control, indicating that fluorination improved the slippage of the surface.

EXPERIMENT 4

The same apparatus as shown in FIG. 1 was used except that the seal means of FIG. 2 were replaced by the seal means of FIG. 5. A polyester sheet of 100 μm thick was subjected on either surface to water repellent treatment by the following procedure. After the treatment, contact angle was measured.

The results are shown in Table 5.

Procedure

With the polyester sheet 2 extended, the chamber 1 was evacuated through the air vent 5, and the slit means 21 and 21 were evacuated through the vents 23 and 23 at the same time by a vacuum pump. High purity helium gas was introduced into the chamber 1 to purge the chamber with helium gas. Then a gas mixture of 1% $CF_4$ diluted with helium gas was fed into the chamber 1 at a predetermined flow rate. A voltage of 3 kV at 8 kHz was applied across the electrodes 7 and 7 to produce a discharge plasma. The polyester sheet 2 was continuously treated by moving it through the chamber 1.

TABLE 5

| Sheet moving speed (m/min.) | Treating time* (sec.) | Contact angle** (deg.) |
|---|---|---|
| 3 | 2 | 115.3 |
| 1 | 6 | 116.0 |
| 0.3 | 20 | 115.8 |
| 0.1 | 60 | 116.2 |
| Control | — | 75.2 |

*the retention time of a point on the sheet in the plasma region
**an average of 20 randomly selected measurements As evident from Table 5, the sheet samples treated at varying treating rates and times showed a markedly increased contact angle as compared with Control (no treatment), indicating that the polyester sheet on the surface was uniformly rendered water repellent through the continuous treatment.

A polyester sheet on the surface was subjected to water repellent treatment by the same procedure as above except that the apparatus shown in FIG. 4 having the seal means of FIG. 5 located near the bottom of the chamber was used. A stable discharge plasma was maintained to ensure effective water repellent treatment even when the flow rate of the reaction gas or gas mixture fed into the chamber was reduced to about one-half.

While the invention has been described with reference to preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. An apparatus for the continuous surface treatment of a length of sheet material, comprising a treating chamber adapted to receive therein helium gas or a gas mixture predominantly comprising helium gas and including entrance and exit ports for passage of a length of sheet material therethrough, means in the chamber for creating a plasma region in the helium gas or gas mixture, vent means for evacuating air from within said chamber, feed means for feeding helium gas or a gas mixture predominantly comprising helium gas into said chamber, seal means for sealing the entrance and exit ports in a less than gas tight manner to allow leakage of the helium gas or gas mixture, and means for continuously moving the length of sheet material into and out of said chamber through the entrance and exit ports, whereby the sheet is passed through the plasma region where the sheet on its surface is continuously subjected to plasma discharge treatment.

2. The apparatus of claim 1 wherein the surface treatment is surface modification.

3. The apparatus of claim 1 wherein the surface treatment is coating.

4. The apparatus of claim 1 wherein the gas mixture is a mixture of helium gas and 0 to 30% by volume of the helium gas of a member selected from the group consisting of $O_2$, $N_2$, $CF_4$, $C_2F_6$, $CH_4$, and $C_2H_4$.

5. The apparatus of claim 1 wherein the plasma creating means includes a pair of spaced apart electrodes disposed in the chamber and a power supply electrically connected thereto.

6. The apparatus of claim 5 wherein the power supply applies a voltage of 0.5 to 10 kV at a frequency of at least 50 Hz.

7. The apparatus of claim 1 wherein the moving means moves sheet at a speed to provide a treating time of 0.1 to 1000 seconds at a point on the sheet.

* * * * *